United States Patent
Kamio

(10) Patent No.: US 9,197,180 B2
(45) Date of Patent: Nov. 24, 2015

(54) AUDIO UNIT MOUNTABLE IN PERSONAL WATERCRAFT

(71) Applicant: Kawasaki Jukogyo Kabushiki Kaisha, Kobe-shi, Hyogo (JP)

(72) Inventor: Kunihiko Kamio, Kobe (JP)

(73) Assignee: Kawasaki Jukogyo Kabushiki Kaisha, Kobe-shi (JP)

( * ) Notice: Subject to any disclaimer, the term of this patent is extended or adjusted under 35 U.S.C. 154(b) by 371 days.

(21) Appl. No.: 13/727,329

(22) Filed: Dec. 26, 2012

(65) Prior Publication Data
US 2014/0177865 A1 Jun. 26, 2014

(51) Int. Cl.
*H03G 3/20* (2006.01)
*H03G 3/32* (2006.01)

(52) U.S. Cl.
CPC ..................... *H03G 3/32* (2013.01)

(58) Field of Classification Search
CPC ............ H03G 3/20; H03G 3/32; H03G 3/00; H03G 5/025; H03G 5/16; H03G 3/005; H03G 3/24; H04R 1/20; H04B 1/00; H04B 10/2942; H04B 10/296; H04B 10/6931; H04B 2203/5425
USPC ............ 381/57, 86, 107, 104, 300, 334, 71.1, 381/94.1, 56, 106, 108, 109, 71, 73.1, 71.4, 381/94, 120
See application file for complete search history.

(56) References Cited

U.S. PATENT DOCUMENTS

| | | | |
|---|---|---|---|
| 6,360,158 B1 * | 3/2002 | Hanawa et al. | 701/93 |
| 2005/0098596 A1 * | 5/2005 | Yano et al. | 224/413 |
| 2006/0029237 A1 * | 2/2006 | Aikins | 381/107 |
| 2012/0067264 A1 * | 3/2012 | Aoyama | 114/55.5 |

* cited by examiner

*Primary Examiner* — Vivian Chin
*Assistant Examiner* — Ubachukwu Odunukwe
(74) *Attorney, Agent, or Firm* — Alleman Hall McCoy Russell & Tuttle LLP

(57) ABSTRACT

An audio unit mountable in a personal watercraft, comprises a speaker, an automated adjustment device for automatically adjusting a volume of a sound emitted from the speaker such that the volume of the sound becomes an automated sound volume value corresponding to an engine speed or a watercraft speed, and a sound volume manipulation member manipulated by a rider to change the volume of the sound emitted from the speaker with respect to the automated sound volume value; wherein when the engine speed or the watercraft speed satisfies a predetermined deceleration condition, the automated adjustment device cancels a sound volume increase amount with respect to the automated sound volume value which was caused by the rider's manipulation of the sound volume manipulation member before the predetermined deceleration condition is satisfied, and adjusts the sound volume such that the volume of the sound becomes the automated sound volume value.

11 Claims, 7 Drawing Sheets

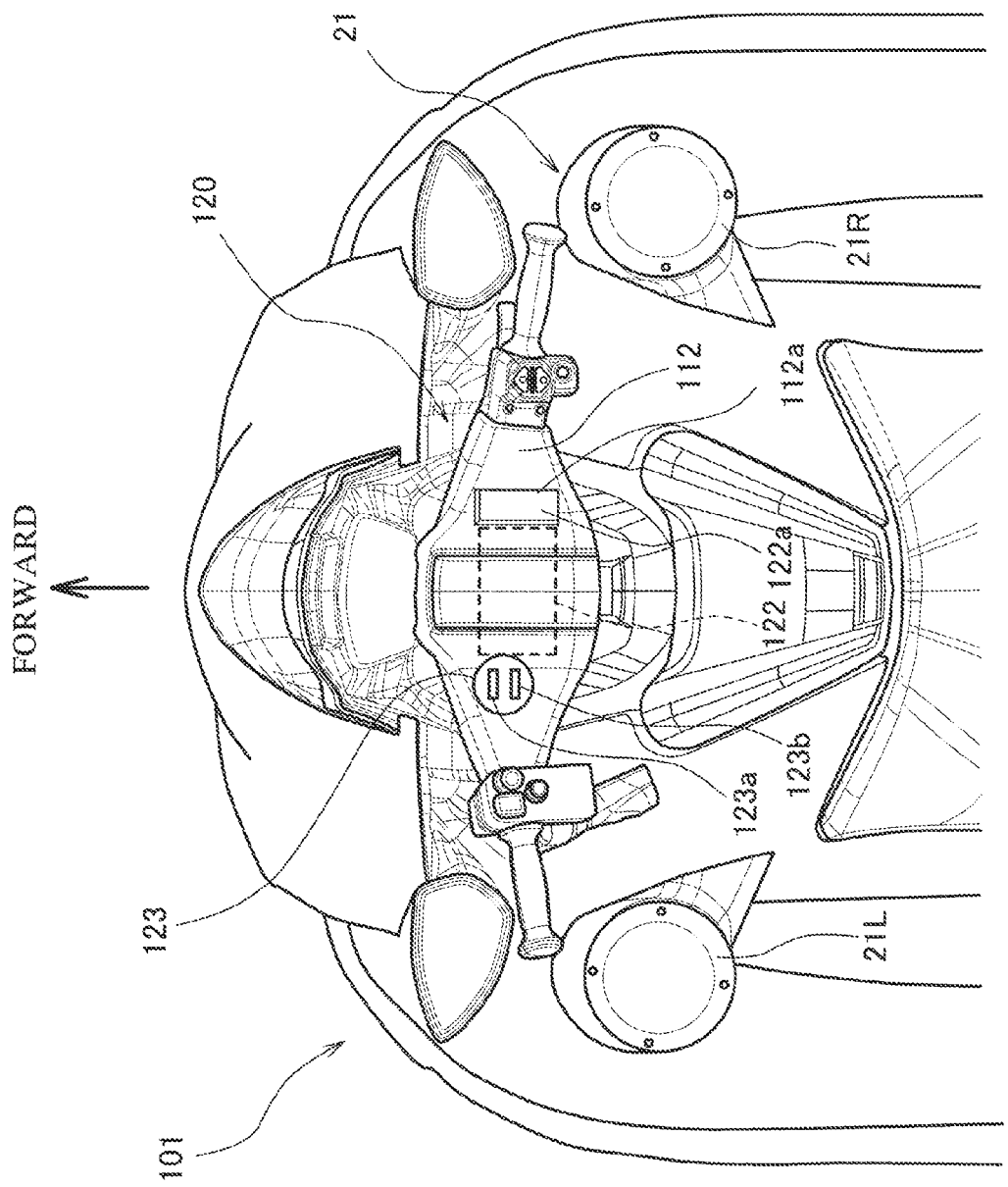

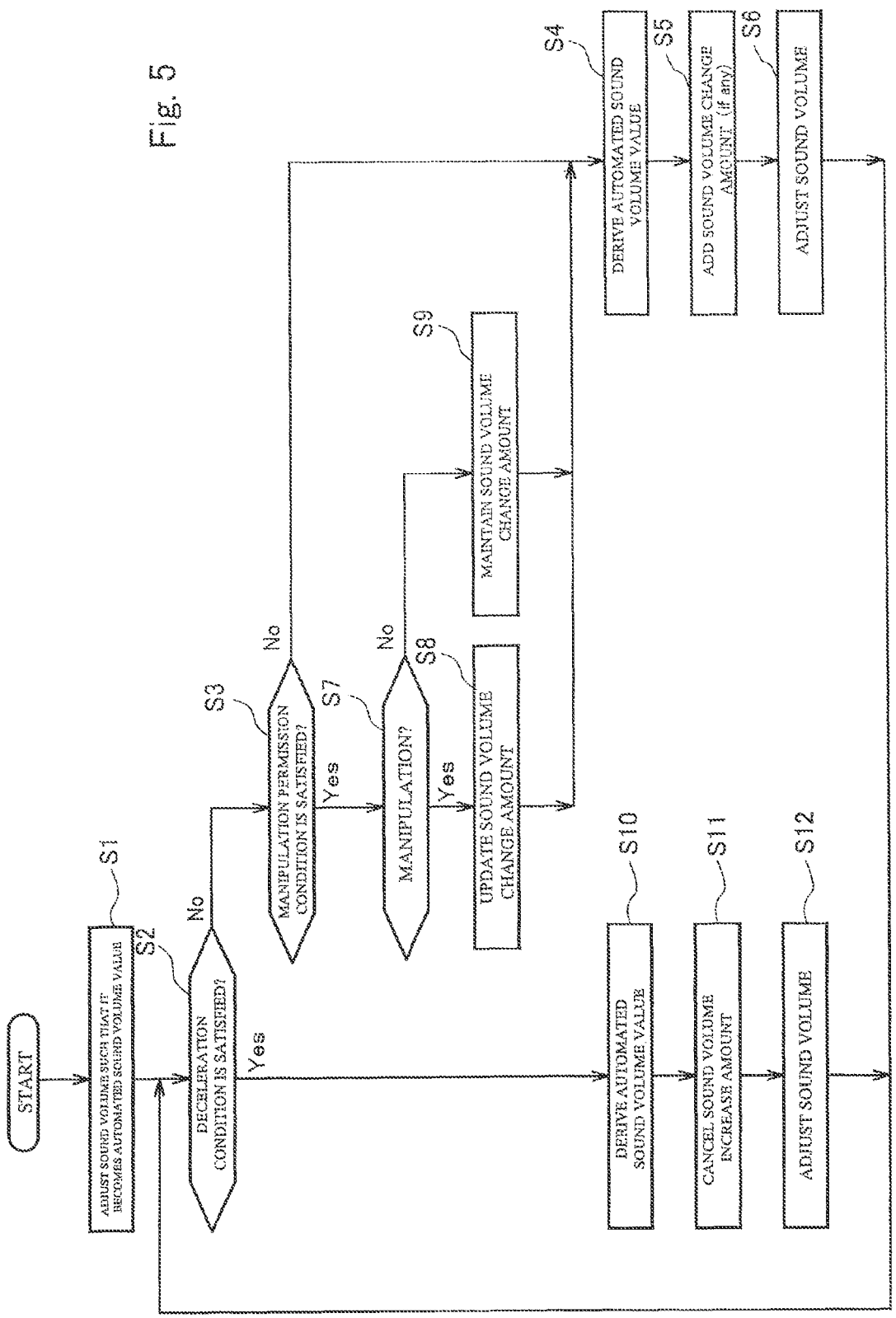

AUDIO UNIT MOUNTABLE IN PERSONAL WATERCRAFT

BACKGROUND OF THE INVENTION

1. Field of the Invention

The present invention relates to an audio unit mountable in a personal watercraft (PWC).

2. Description of the Related Art

United States Patent Application Publication No. 2012/0067264 discloses that a personal watercraft (PWC: hereinafter simply referred to as a watercraft) is equipped with an audio unit including a speaker and a sound volume manipulation unit. A rider can adjust a volume of a sound emitted from the speaker suitably by manipulating the sound volume manipulation unit.

During planing of the watercraft, with an increase in an engine speed, a ship speed increases, and an engine noise and a wind noise become louder correspondingly. For this reason, during high-speed planing, the rider cannot hear the sound emitted from the speaker unless the sound volume is adjusted to be considerably higher. When a throttle valve is moved to a closed position in the high-speed planing, the watercraft is decelerated by a body resistance, and the engine noise and the wind noise are diminished. However, regardless of such a quiet environment, a sound with a great volume having been adjusted according to the high-speed planing may be emitted from the speaker undesirably. Since the rider must stabilize the rider's attitude and the body's attitude under a state in which the body resistance and an inertia force are working, during the deceleration of the watercraft, it is very difficult for the rider to reduce the volume of the sound by manipulating the sound volume manipulation unit it in this situation.

SUMMARY OF THE INVENTION

The present invention addresses the above described condition, and an object of the present invention is to prevent a sound with a great volume from being emitted from an audio unit mountable in (for use with) a personal watercraft undesirably, without forcing a rider to perform a particular manipulation.

An audio unit mountable in a personal watercraft of the present invention comprises a speaker, an automated adjustment device connected to the speaker for automatically adjusting a volume of a sound emitted from the speaker such that the volume of the sound becomes an automated sound volume value corresponding to an engine speed or a watercraft speed, and a sound volume manipulation member configured to be manipulated by a rider to change the volume of the sound emitted from the speaker with respect to the automated sound volume value; wherein when the engine speed or the watercraft speed satisfies a predetermined deceleration condition, the automated adjustment device cancels a sound volume increase amount with respect to the automated sound volume value which was caused by the rider's manipulation of the sound volume manipulation member before the predetermined deceleration condition is satisfied, and adjusts the volume of the sound emitted from the speaker such that the volume of the sound becomes the automated sound volume value.

In accordance with this configuration, the rider can suitably adjust the volume of the sound emitted from the speaker by manipulating the sound volume manipulation member. This allows the rider to enjoy high-speed planing while hearing music, etc., emitted from the speaker. Even when the personal watercraft is decelerated rapidly in the high-speed planing state, the sound volume is automatically adjusted to become the automated sound volume value corresponding to a decreased speed, if the deceleration satisfies the predetermined deceleration condition. This makes it possible to automatically reduce the sound volume when an engine noise and a wind noise are diminished instantly according to the rapid deceleration. As a result, it is possible to prevent a sound with a great volume from being emitted undesirably from the audio unit mountable in the personal watercraft in a quiet environment.

The above and further objects, features and advantages of the invention will more fully be apparent from the following detailed description with reference to the accompanying drawings.

BRIEF DESCRIPTION OF THE DRAWINGS

FIG. 2B is a plan view of a front portion of a personal watercraft equipped with an audio unit according to a modified example.

FIG. 5 is a flowchart showing a procedure of control executed by the audio unit of FIG. 3.

DETAILED DESCRIPTION OF THE PREFERRED EMBODIMENTS

Hereinafter, an embodiment of the present invention will be described with reference to the drawings. Throughout the drawings, the same or corresponding components are designated by the same reference symbols and will not be described in repetition. The stated directions are referenced from the perspective of a rider riding on personal watercraft.

Figure 1:
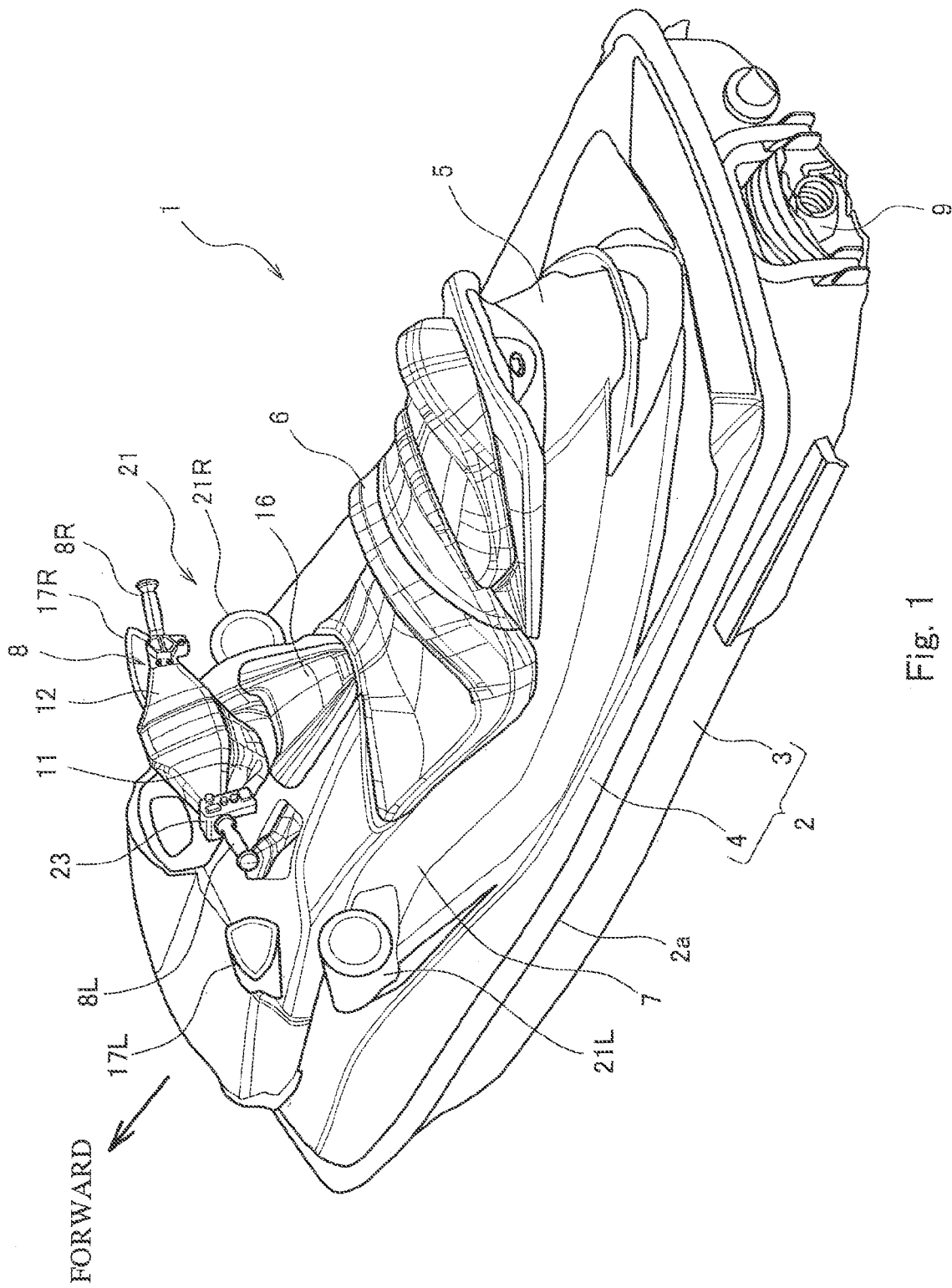
FIG. 1 is a perspective view showing an external appearance of a personal watercraft according to an embodiment of the present invention.

FIG. 1 is a perspective view showing an external appearance of a personal watercraft 1 (watercraft) according to an embodiment. Referring to FIG. 1, a body 2 of the watercraft 1 includes a hull 3 and a deck 4 covering the hull 3 from above. A rear portion of the deck 4 has a protruding portion 5 protruding upward from a center portion in a body width direction. A seat 6 is mounted over an upper surface of the protruding portion 5. The rider and a passenger can straddle the seat 6 in a state in which they are arranged in a lengthwise direction of the body 2. A front portion of the deck 4 has a protruding portion 7 protruding upward from a center portion in the body width direction. A handle 8 is attached to an upper portion of the protruding portion 7. The rider straddling the seat 6 can grip a pair of right and left grips 8R and 8L attached to the handle 8 with the rider's hands.

An engine (not shown) as a driving power source is built into the watercraft 1. The engine is disposed in a space defined by the hull 3 and the deck 4. An ejecting port 9 is provided on a rear surface of the hull 3. Through the ejecting port 9, a water jet discharged from a water-jet pump (not shown) driven by the engine is ejected in a rearward direction from the body 2. As the resulting reaction, the watercraft 1 can be moved in a forward direction. When the rider rotates the handle 8, a direction of the ejecting port 9 is changed, and thereby the watercraft 1 can be turned.

The handle 8 includes a handle pole 11 extending vertically and protruding upward from the protruding portion 7. A handle pad 12 is provided at an upper end portion of the handle pole 11. The pair of grips 8R and 8L protrudes to a right and to a left, respectively, from the handle pad 12.

Figure 2A:
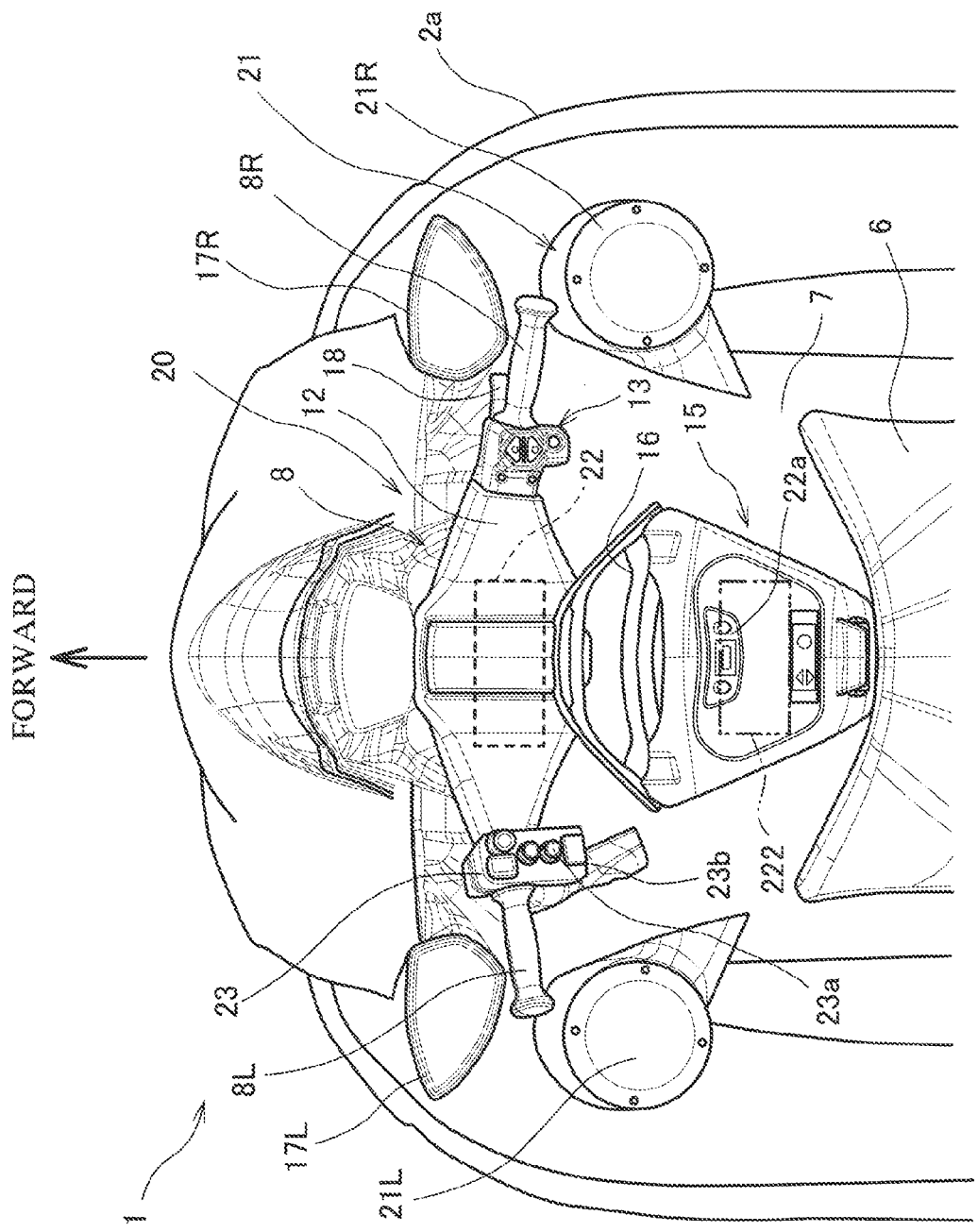
FIG. 2A is a plan view of a front portion of the personal watercraft of FIG. 1.

FIG. 2A is a plan view of a front portion of the personal watercraft 1 of FIG. 1. As shown in FIG. 2A, a throttle lever 18 is attached to a base portion of the right grip 8R to input an acceleration or deceleration command by the rider. An automated cruise switch 13 is attached to the base portion of the right grip 8R to input a constant speed command by the rider. When the rider turns ON the automated cruise switch 13, an electronic control unit (ECU) 14 (see FIG. 3) built into the watercraft 1 executes an automated cruise mode in which a watercraft speed is made constant. The automated cruise switch 13 includes a watercraft speed adjustment switch for increasing or decreasing a target watercraft speed. When the rider manipulates the watercraft speed adjustment switch, the target watercraft speed in the automated cruise mode can be changed according to the rider's preference. A storage box 15 is disposed on an upper portion of the protruding portion 7 in a location between the seat 6 and the handle pole 11 in the lengthwise direction of the watercraft 1. The storage box 15 is opened and closed by a lid 16 pivotally attached to the protruding portion 7. The rider can accommodate articles into the storage box 15 during driving of the watercraft 1.

An audio unit 20 is mounted in the watercraft 1. The rider can drive the watercraft 1 while enjoying music by using the audio unit 20. The audio unit 20 includes as major components a speaker unit 21, an amplifier 22 which is an exemplary automated adjustment device, and a manipulation unit 23. In the present embodiment, the speaker unit 21 includes a right speaker 21R and a left speaker 21L. The speakers 21R and 21L are arranged in the same locations in the lengthwise direction of the watercraft 1. The speakers 21R and 21L are arranged outward in the body width direction relative to the seat 6 and inward in the body width direction relative to a gunnel line 2a. In the present embodiment, the right speaker 21R protrudes to the right from a right surface of the protruding portion 7, while the left speaker 21L protrudes to the left from a left surface of the protruding portion 7. The watercraft 1 includes a pair of right and left side minors 17R and 17L to enable the rider straddling the seat 6 to check a scene behind during driving. The right side mirror 17R protrudes from the right surface of the protruding portion 7 and the left side minor 17L protrudes from the left surface of the protruding portion 7. The right and left speakers 21R and 21L are positioned below the right and left side minors 17R and 17L, respectively, to allow the rider straddling the seat 6 to see the scene behind.

The amplifier 22 is built into the inside of the handle pad 12 and is not exposed to the outside of the watercraft 1. Inside of the handle pad 12, an amplifier storage section (not shown) is formed to accommodate the amplifier 22 therein. Since the amplifier 22 is built into inside of the handle pad 12 in this way, the amplifier 22 can be protected from water splashes. As shown in FIG. 2A, an amplifier 222 (see two-dotted line) may be accommodated into the storage box 15 which is opened and closed by the lid 16. The audio unit 20 of the present embodiment is capable of reproducing audio data stored in an outside sound source device (not shown in FIG. 2A) connectable to the amplifier 22. The sound source device is, for example, a portable audio player which is capable of storing the audio data in a built-in memory, which is a typical example.

Alternatively, the sound source device may be accommodated into the storage box 15. In this case, an input terminal 22a of terminals of the amplifier 22 which is connectable to the sound source device is disposed inside of the storage box 15. The lid 16 is closed during driving of the watercraft 1, and thus the sound source device accommodated in the storage box 15 can be protected from the water splashes, etc.

The manipulation unit 23 includes a power supply switch 23a for switching ON/OFF of the audio unit 20 and a sound volume manipulation member 23b which can be manipulated by the rider to adjust a volume of a sound emitted from the speaker unit 21. The manipulation unit 23 may be disposed in any location at which the rider can easily manipulate the manipulation unit 23. In the present embodiment, the manipulation unit 23 is disposed at a base portion of the left grip 8L. The rider can manipulate the manipulation unit 23 with a left thumb to easily turn ON/OFF a power supply of the audio unit 20 and adjust the volume of the sound emitted from the speaker unit 21. The throttle lever 18 is attached to the right grip 8R, while the manipulation unit 23 is attached to the left grip 8L. This layout enables the rider to manipulate the manipulation unit 23 irrelevantly from an input manipulation of an acceleration or deceleration command by using the throttle lever 18.

FIG. 2B is a plan view of a front portion of a personal watercraft 101 incorporating an audio unit 120 according to a modified example. Referring to FIG. 2B, a manipulation unit 123 may be attached to a handle pad 112. In this case, the manipulation unit 123 is preferably embedded in a portion of the handle pad 112 such that the manipulation unit 123 does not protrude from an outer surface of the handle pad 112 to prevent the rider from touching the manipulation section 123 inadvertently. The manipulation unit 123 is preferably attached to a portion (in the present embodiment, left portion) of the handle pad 112 which is at an opposite side of a location of the throttle lever 18 in a rightward and leftward direction. This enables the rider to manipulate the manipulation unit 123 irrelevantly from an input manipulation of an acceleration or deceleration command.

The handle pad 112 may be provided with a recessed portion (concave portion) 112a in which the sound source device (not shown) is disposed. In this case, an input terminal of terminals of an amplifier 122 which is connectable to the sound source device is disposed inside of the recessed portion 112a. The recessed portion 112a has an adequate depth to prevent the sound source device from being exposed to the outer surface of the handle pad 112. This makes it possible to prevent the sound source device from contacting the rider inadvertently, and reduce a chance that the sound source device will get wet by water splashes. Since the sound source device is installed in this way, a manipulation member of the sound source device can be exposed to outside. This allows the rider to easily perform manipulations such as reproduction, fast-forward, rewind, etc., by the manipulation member of the sound source device during driving of the watercraft 1.

In a further alternative, the example of FIG. 2A may be combined with the example of FIG. 2B. That is, the manipulation unit may be attached to the base portion of the grip and the handle pad may be provided with a recessed portion in which the sound source device is disposed. Or, the manipulation unit may be attached to the handle pad and the sound source device may be accommodated into the storage box.

Figure 3:
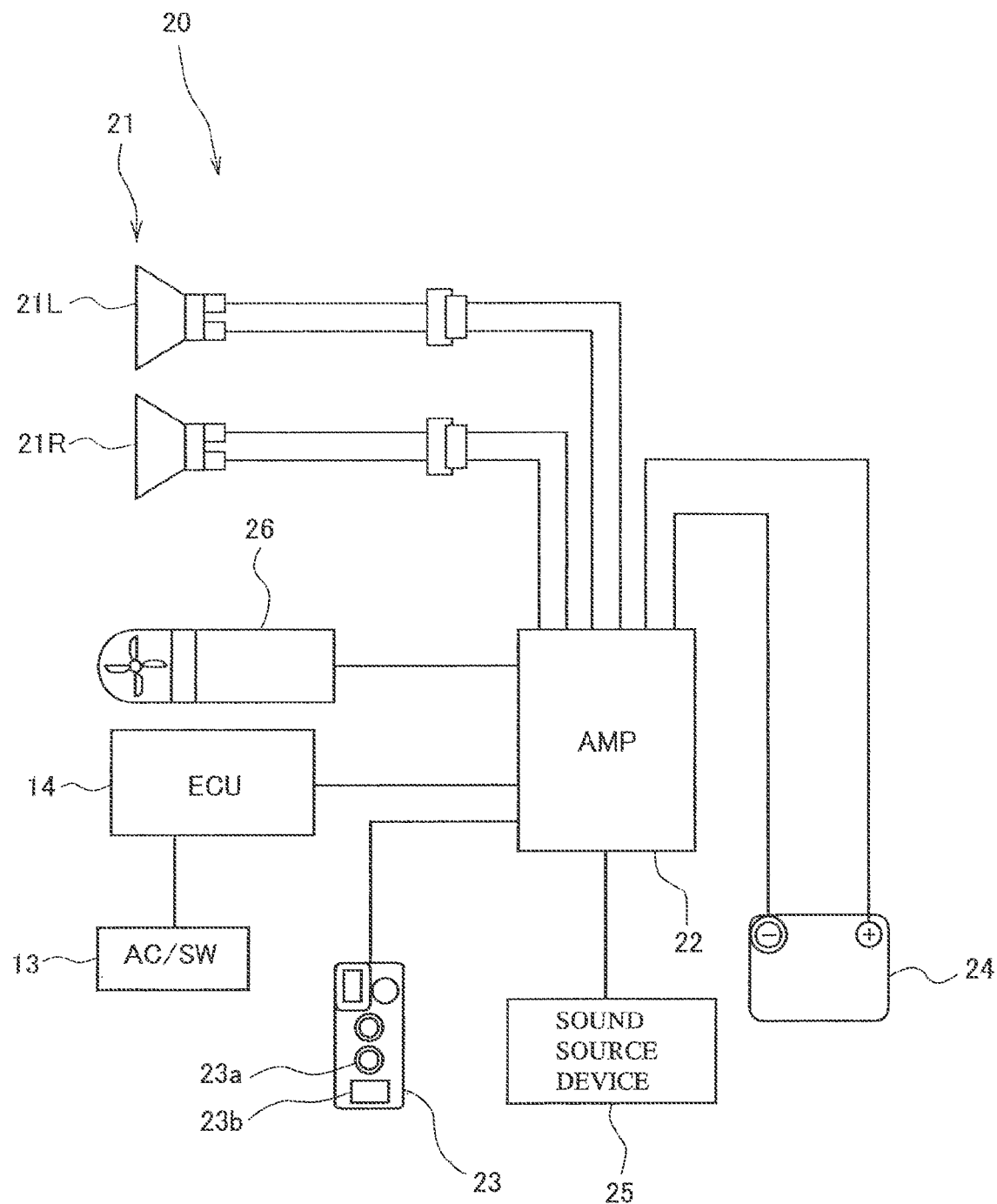
FIG. 3 is a block diagram showing a configuration of an audio unit mountable in the personal watercraft of FIG. 1.

FIG. 3 is a block diagram showing a configuration of the audio unit 20 of FIG. 2A. Referring to FIG. 3, the amplifier 22 is connected to a battery 24 for actuating auxiliary devices mounted in the watercraft 1. When the amplifier 22 is supplied with electric power from the battery 24 as an electric power supply, the overall audio unit 20 is turned ON. For example, the power supply switch 23a opens and closes a power feeding line connecting the battery 24 to the amplifier 22. The amplifier 22 is connected at a signal input side to the above stated sound source device 25. The amplifier 22 is connected at a signal output side to the speaker unit 21 (in the present embodiment, the left speaker 21L and the right speaker 21R). When the sound source device 25 connected to the amplifier 22 performs a reproduction operation of audio data, the amplifier 22 amplifies an electric signal output from the sound source device 25 and transmits the amplified electric signal to the speaker unit 21, which reproduces music. Note that the amplifier 22 of the present embodiment may include both of a control amplifier (or preamplifier) and a power amplifier (or main amplifier), or may include only the power amplifier.

The amplifier 22 serves as an automated adjustment device for automatically adjusting the volume of the sound emitted from the speaker unit 21 such that the sound volume becomes an automated sound volume value corresponding to an engine speed (the number of revolutions of the engine) or a watercraft speed of the watercraft 1 (hereinafter these speeds will be collectively referred to as a speed). A device for automatically adjusting the sound volume may sometimes be incorporated into the audio unit 20 separately from the amplifier 22. To implement the automated adjustment, the amplifier 22 is connected at the signal input side to a speed sensor 26 for detecting the speed. The speed sensor 26 is connected to the ECU 14. Therefore, the amplifier 22 may be connected to the ECU 14 in addition to or instead of the speed sensor 26. In the case where the amplifier 22 is connected to the ECU 14, the amplifier 22 may receive as an input a signal indicating whether or not an automated cruise mode is activated. In the automated cruise mode, control is performed to maintain the watercraft speed at a constant value. Therefore, the signal from the ECU 14 may be handled as a signal indicating the watercraft speed as well as a signal indicating that the watercraft speed is at a constant speed.

FIGS. 4A-4H are graphs conceptually showing examples of the automated sound volume value corresponding to the engine speed or the speed (watercraft speed) of the watercraft 1. The amplifier 22 contains any one of correspondences between speeds and automated sound volume values shown in these graphs. The amplifier 22 derives the automated sound volume value corresponding to the speed, with reference to the correspondence R stored therein. As can be seen from the graphs 4A-4H, the automated sound volume values have positive correlations with the speeds.

Figure 4A:
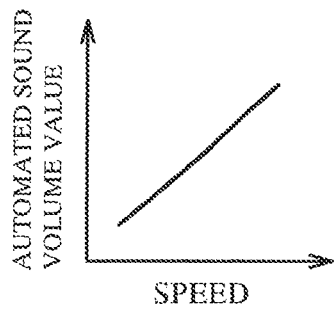
FIGS. 4A-4H are graphs conceptually showing examples of an automated sound volume value corresponding to an engine speed or a watercraft speed.
Figure 4B:
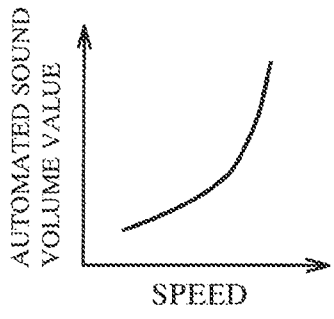
Figure 4C:
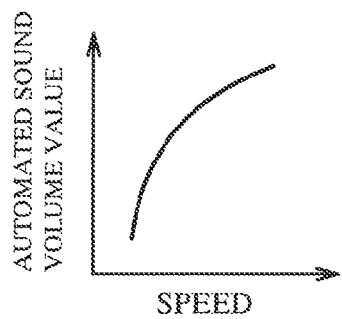
Figure 4D:
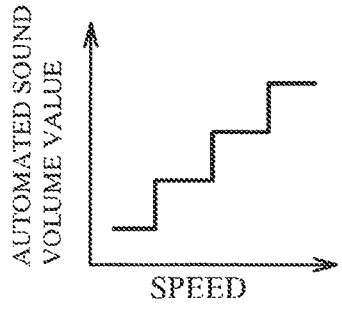
Figure 4E:
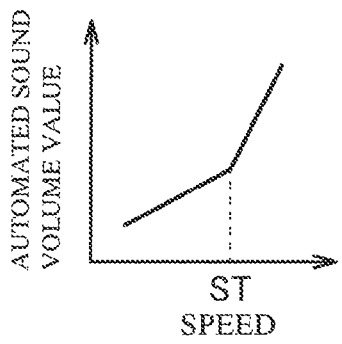
Figure 4F:
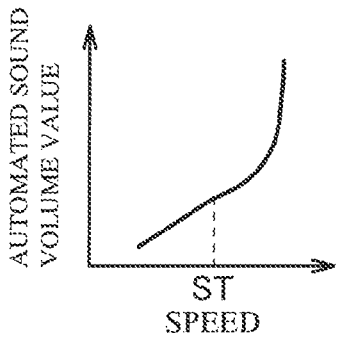
Figure 4G:
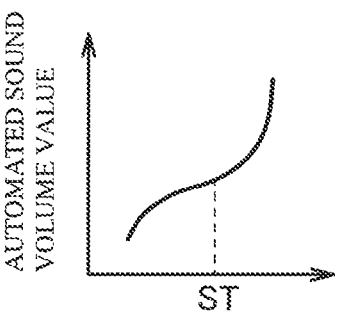
Figure 4H:
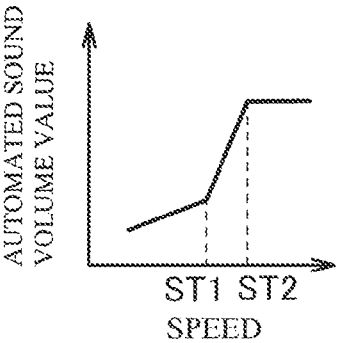

For example, the automated sound volume value may increase continuously with an increase in the speed (see graphs 4A-4C), increase in a stepwise manner with an increase in the speed (see graph 4D), increase linearly with an increase in the speed (see graph 4A), or increase non-linearly with an increase in the speed (see FIGS. 4B and 4C). In the case where the automated sound volume value increases non-linearly, an increase amount of the automated sound volume value corresponding to a unit increase amount of the speed may be greater as the speed is higher (see graph 4B), or the increase amount of the automated sound volume value corresponding to the unit increase amount of the speed may be smaller as the speed is higher (see graph 4C).

Or, different correspondences may be combined on the basis of speed thresholds ST (ST1, ST2) (see graphs 4E-4H). For example, the automated sound volume value may change linearly in a low-speed range and in a high-speed range, and an increase rate of the automated sound volume value in the high-speed range may be greater than that in the low-speed range (see graph 4E). The automated sound volume value may change linearly in the low-speed range, and non-linearly in the high-speed range as shown in the graph 4B (see graph 4F). The automated sound volume value may change non-linearly in the low-speed range as shown in the graph 4C and non-linearly in the high-speed range as shown in the graph 4B (see graph 4G). To set correspondences in three or more speed ranges, respectively, two or more speed thresholds ST1, ST2 may be set (see graph 4H). In this case, in a particular speed range (e.g., high-speed range), the automated sound volume value may not be changed irrespective of a speed change (see graph 4H).

Turning back to FIG. 3, as the speed increases, the automated sound volume value increases. The amplifier 22 amplifies the electric signal so that music is emitted from the speaker unit 21 with the automated sound volume value defined as described above. As the speed increases, the sound volume increases automatically. Thus, the sound volume is automatically changed into a sound volume adapted to high-speed planing without a need for the rider to adjust the sound volume by manipulating the sound volume manipulation member 23b. When the watercraft 1 is accelerated and an engine noise and a wind noise become louder, the rider can continue to enjoy the music emitted from the speaker unit 21 without the rider's particular manipulation. On the other hand, when the watercraft speed is decreased, the sound volume is changed automatically into one adapted to a quiet environment.

Although the audio unit 20 according to the present embodiment has the above stated automated sound volume adjustment function, the rider can increase the volume of the sound emitted from the speaker unit 21 to a value greater than the automated sound volume value by manipulating the sound volume manipulation member 23b. If the rider wishes to enjoy planing while hearing music with a greater sound volume, the rider can satisfy such a desire by using the sound volume manipulation member 23b. Or, the rider can reduce the volume of the sound emitted from the speaker unit 21 to a value less than the automated sound volume value by manipulating the sound volume manipulation member 23b.

Thus, the audio unit 20 of the present embodiment has the manual sound volume adjustment function as well as the automated sound volume adjustment function. In addition to these functions, the audio unit 20 has an automated cancel function for cancelling an increase amount of the sound volume caused by the rider's manipulation of the sound volume manipulation member 23b and returning the sound volume to the automated sound volume value. The automated cancel function is activated, for example, when the speed satisfies a predetermined deceleration condition. When the speed satisfies the predetermined deceleration condition, the amplifier 22 cancels an increase amount of the sound volume with respect to the automated sound volume value which was caused by the rider's manipulation of the sound volume manipulation member 23b before the deceleration condition is satisfied, and adjusts the volume of the sound emitted from the speaker unit 21 such that the sound volume becomes the automated sound volume value. In a case where the rider reduced the sound volume to a value less than the automated sound volume value by manipulating the sound volume manipulation member 23b, the amplifier 22 may keep a reduction amount of the sound volume with respect to the automated sound volume value. Or, the audio unit 20 may further have a function for cancelling a change amount of the sound volume with respect to the automated sound volume value, in response to the rider's pressing operation on a cancel button provided on the manipulation unit 23.

FIG. 5 is a flowchart showing a procedure of control executed by the audio unit 20 of FIG. 3. Hereinafter, hardware components are designated by the corresponding reference symbols in FIGS. 1 to 4. The procedure shown in FIG. 5 is initiated when the power supply switch 23a is turned ON and terminates when the power supply switch 23a is turned OFF.

When the power supply switch 23a is turned ON, initially, the amplifier 22 automatically adjusts the volume of the sound emitted from the speaker unit 21 so that the sound volume becomes the automated sound volume value (S1). Then, the amplifier 22 determines whether or not a deceleration condition is satisfied (S2). If it is determined that the deceleration condition is not satisfied (S2: NO), the amplifier 22 determines whether or not a manipulation permission condition is satisfied (step S3).

The deceleration condition is used to determine whether or not to cancel the increase amount of the sound volume with respect to the automated sound volume value, which was caused by the rider's manipulation, i.e., whether or not to perform the automated cancel function. The deceleration condition may be, for example, such that the speed decreases and crosses a low-speed threshold, i.e., the engine speed or the watercraft speed becomes less than the low-speed threshold. Or, the deceleration condition may be, for example, such that a change rate of the engine speed or a change rate of the watercraft speed becomes less than a negative change rate threshold (i.e., a decreasing degree of the engine speed or a decreasing degree of the watercraft speed is greater in absolute value than a predetermined value), or the change rate continues to be less than the change rate threshold for a predetermined time period (i.e., the decreasing degree of the engine speed or the decreasing degree of the watercraft speed continues to be greater in absolute value than the predetermined value for the predetermined time period). The change rate threshold is preferably set in view of a decreasing degree of a speed in a case where the throttle lever 18 is released to move a throttle valve to a fully closed position. This makes it possible to prevent the sound volume from being changed to the automated sound volume value even when the throttle lever 18 is slightly released to decelerate the watercraft 1 during high-speed planing of the watercraft 1.

Or, the deceleration condition may be such that any one of the above stated conditions is satisfied (OR condition), or all of the above stated conditions are satisfied (AND condition). The deceleration condition may include a condition other than the above stated conditions. This condition may form the OR condition or the AND condition. In a case where the deceleration condition is set in view of the change rate of the engine speed or the change rate of the watercraft speed, the amplifier 22 may calculate the change rate of the engine speed (angular acceleration of an engine output shaft) or the change rate of the watercraft speed (acceleration of the watercraft 1). In a case where the amplifier 22 is connected to the ECU 14 which calculates the change rate of the engine speed or the change rate of the watercraft speed, the amplifier 22 may receive as an input the change rate of the speed from the ECU 14.

The manipulation permission condition is used to determine whether or not to permit the rider to adjust the sound volume by manipulating the sound volume manipulation member 23b. The manipulation permission condition may be, for example, such that the engine speed or the watercraft speed continues to be substantially constant for a predetermined time period. In this determination, the amplifier 22 may calculate the change rate of the speed or receive as the input the change rate calculated by the ECU 14 as described above. During the automated cruise mode, the speed is maintained at a constant value. In view of this, the manipulation permission condition may include a condition in which the automated cruise mode is activated.

When the deceleration condition is not satisfied (S2: NO) and the manipulation permission condition is not satisfied (S3: NO), the amplifier 22 derives the automated sound volume value corresponding to the speed (S4). The amplifier 22 adds a change amount of the sound volume caused by the manipulation of the sound volume manipulation member 23b, if any, to the automated sound volume value, thereby deriving a final sound volume value (S5). The amplifier 22 adjusts the volume of the sound emitted from the speaker unit 21 so that the sound volume becomes the sound volume value derived in step S5 (S6). Then, the process returns to step S2 to determine whether or not deceleration condition is satisfied.

In step S5, the change amount of the sound volume is considered even though the manipulation permission condition is not satisfied. Thus, in a case where the sound volume was adjusted by the rider's manipulation of the sound volume manipulation member 23b, because the manipulation permission condition was satisfied previously, the manipulation permission condition is not satisfied at present (subsequently), and the deceleration condition is not satisfied at present, for example, during acceleration of the watercraft 1, the sound volume changed previously is kept. This eliminates a need for the rider to perform the manipulation again when the manipulation permission condition is satisfied next, for example, after the end of the acceleration. Since the deceleration condition and the manipulation permission condition are used separately, the above stated control is enabled.

When the deceleration condition is not satisfied (S2: NO) and the manipulation permission condition is satisfied (S3: YES), the amplifier 22 determines whether or not the rider adjusted the sound volume by manipulating the sound volume manipulation member 23b (S7). If it is determined that the rider manipulated the sound volume manipulation member 23b (S7: YES), the amplifier 22 updates a change amount of the sound volume with respect to the automated sound volume value, which was caused by the rider's manipulation of the sound volume manipulation member 23b (S8). Then, the amplifier 22 performs step S4 and step S5 and then adjusts the volume of the sound emitted from the speaker unit 21 so that the sound volume becomes a sound volume value obtained by adding the updated sound volume change amount (S6). On the other hand, if it is determined that the rider did not manipulate the sound volume manipulation member 23b (S7: NO), the amplifier 22 maintains the change amount of the sound volume with respect to the automated sound volume value (S9), and the process goes to step S4-S6, and returns to step S2 to determine whether or not the deceleration condition is satisfied. The change amount of the sound volume in step S8 and in step S9 includes a plus change amount (i.e., sound volume increase amount), a minus change amount (i.e., sound volume reduction amount), and zero.

When it is determined that the deceleration condition is satisfied (S2: YES), the amplifier 22 derives the automated sound volume value corresponding to the speed (S10), and cancels a sound volume increase amount with respect to the automated sound volume value, which was caused by the rider's manipulation before the deceleration condition is satisfied (S11). That is, the amplifier 22 derives the automated sound volume value corresponding to the speed as a final sound volume value and adjusts the volume of the sound emitted from the speaker 21 such that the sound volume becomes the automated sound volume value corresponding to the speed (S12). Then, the process returns to step S2 to determine whether or not the deceleration condition is satisfied. As described above, when the deceleration condition is satisfied, the automated cancel function is activated.

In step S11, at least the sound volume increase amount is cancelled in light of a primary technical meaning of the automated cancel function. By comparison, the rider can reduce the volume of the sound emitted from the speaker unit 21 to a value less than the automated sound volume value by manipulating the sound volume manipulation member 23b. Accordingly, in step S11, the amplifier 22 may or may not cancel the sound volume reduction amount with respect to the automated sound volume value, in a case where the sound volume was reduced to a value less than the automated sound volume value by manipulating the sound volume manipulation member 23b, before the deceleration condition is satisfied.

Figure 6:
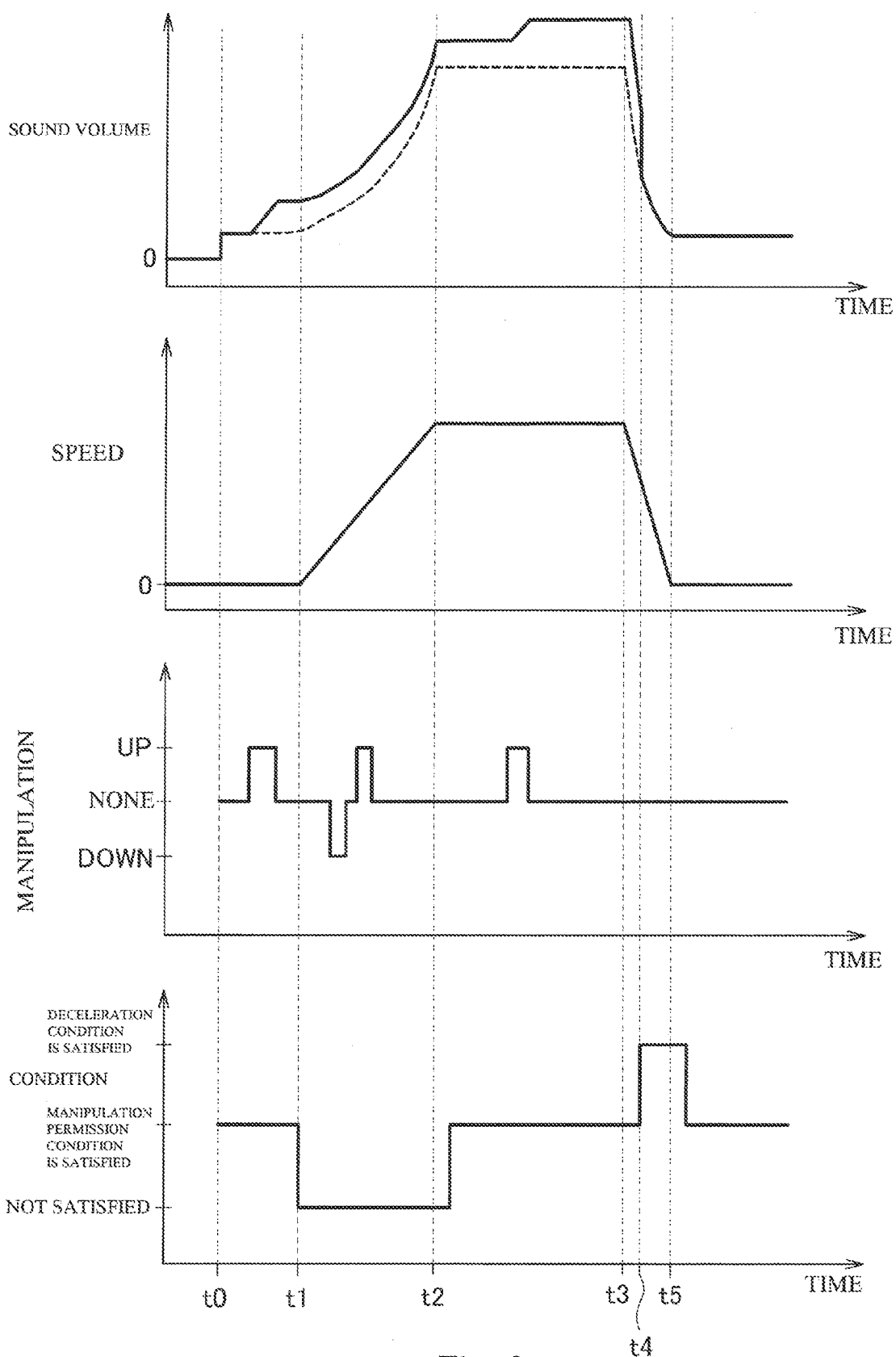
FIG. 6 is a time chart showing an exemplary change in the sound volume which occurs when the procedure of FIG. 5 is executed.

FIG. 6 is a timing chart showing an exemplary sound volume change which occurs with a passage of time in the case where the procedure of FIG. 5 is performed. In the example shown in FIG. 6, it is supposed that the power supply switch 23a is turned ON at a time point $t_0$ at which the watercraft speed is zero, acceleration of the watercraft 1 starts at a time point $t_1$, acceleration of the watercraft 1 ends and constant-speed planing starts at a time point $t_2$, the throttle lever 18 is released and deceleration of the watercraft 1 starts at a time $t_3$. FIG. 6 also shows the speed (watercraft speed), the manipulation of the sound volume manipulation member 23b, and whether or not the deceleration condition and the manipulation permission condition are satisfied, each of which changes with a passage of time. Regarding the sound volume, a solid line indicates the volume of the sound emitted from the speaker unit 21, which changes with a passage of time, while a broken line indicates the automated sound volume value corresponding to the speed, which changes with a passage of time. When the automated sound volume value conforms to the volume of the sound emitted from the speaker unit 21, the solid line is depicted with priority. It is supposed that the amplifier 22 derives the automated sound volume value with reference to the correspondence of FIG. 4B.

When the power supply switch 23a is turned ON, the amplifier 22 derives the automated sound volume value corresponding to the watercraft speed, and performs initial adjustment such that the sound volume becomes the automated sound volume value. During a time period from the time point $t_0$ to the time point $t_1$, the speed is constant. Therefore, the deceleration condition is not satisfied and the manipulation permission condition is satisfied. Under this state, if the rider adjusts the sound volume by manipulating the sound volume manipulation member 23b, the amplifier 22 changes the sound volume from the automated sound volume value in response to the rider's manipulation. FIG. 6 shows a case where the rider increases the sound volume to a value greater than the automated sound volume value by manipulating the sound volume manipulation member 23b during the time period from the time point $t_0$ to the time point $t_1$.

After the time $t_1$, when acceleration of the watercraft 1 starts and its acceleration degree exceeds an allowable value, the deceleration condition is not satisfied and the manipulation permission condition is not satisfied (in the example of FIG. 6, the acceleration degree exceeds the allowable value). When acceleration of the watercraft 1 starts, the automated sound volume value increases, and the volume of the sound emitted from the speaker unit 21 increases automatically. Because of this, even when the engine noise and the wind noise become louder, the rider can hear the music with an increased sound volume emitted from the speaker unit 21.

When the manipulation permission condition is not satisfied, the rider's manipulation is disenabled (in the example of FIG. 6, when the manipulation permission condition is not satisfied, manipulation for increasing or reducing the sound volume is performed). Therefore, the sound volume is changed according to a change in the automated sound volume value, but a change amount of the sound volume with respect to the automated sound volume value cannot be adjusted. However, a change amount of the sound volume which was caused by the manipulation performed when the manipulation permission condition was satisfied previously (in the example of FIG. 6, increase amount of the sound volume caused by the manipulation performed during the time period from the time point $t_0$ to the time point $t_1$) is kept, even when the manipulation permission condition is not satisfied at present (subsequently). Therefore, the rider need not perform the same manipulation after the manipulation permission condition is satisfied next.

After the time $t_2$, when acceleration of the watercraft 1 ends and constant-speed planing starts, the manipulation permission condition is satisfied after a passage of a particular period thereafter. Under this state, the rider can adjust the sound volume by manipulating the sound volume manipulation member 23b. The rider can increase the sound volume easily by manipulating the sound volume manipulation member 23b, when a loud engine noise and a loud wind noise are generated, and the rider cannot hear the music easily unless the sound volume is increased. During high-speed planing, the automated sound volume value increases, and the volume of the sound emitted from the speaker unit 21 increases considerably. Under this state, the rider can make a desired sound volume by slight adjustment. It does not take time to adjust the sound volume during high-speed planing.

After the time $t_3$, when the throttle lever 18 is released rapidly, the watercraft speed significantly decreases by a body resistance. When deceleration of the watercraft 1 starts and a certain time period passes, the deceleration condition is satisfied. During a time period from when deceleration of the watercraft 1 starts until the deceleration condition is satisfied, the automated sound volume value decreases according to the speed, and hence the volume of the sound emitted from the speaker unit 21 reduces.

After the time $t_4$, when the deceleration condition is satisfied, an increase amount of the sound volume with respect to the automated sound volume value, which was caused by manipulating the sound volume manipulation member 23b just before the deceleration condition is satisfied, is cancelled, and the volume of the sound emitted from the speaker unit 21 is forcibly adjusted such that the sound volume becomes the automated sound volume value. Thereafter, the volume of the sound emitted from the speaker unit 21 continues to be adjusted such that the sound volume becomes the automated sound volume value corresponding to the speed until the manipulation permission condition is satisfied. After a time $t_5$, when the deceleration ends and the watercraft speed becomes constant, the manipulation permission condition is satisfied after a passage of a certain time period after the watercraft speed has started to become constant.

Thus, in accordance with the present embodiment, the rider can enjoy high-speed planing while hearing music with a desired sound volume. Then, an increase amount of the sound volume with respect to the automated sound volume value, which was caused by manipulating the sound volume manipulation member 23b just before the deceleration condition is satisfied, is cancelled, and the volume of the sound emitted from the speaker unit 21 becomes the automated sound volume value. Because of this, even when the engine noise and the wind noise are diminished instantly according to rapid deceleration of the watercraft 1, the sound volume is reduced automatically correspondingly. Therefore, without a need for the rider to reduce the sound volume by manipulation during deceleration, it is possible to prevent a sound with a great volume from being emitted from the audio unit 20 undesirably, just after the engine noise and the wind noise are diminished.

Upon the power supply being ON, the amplifier 22 performs initial adjustment of the volume of the sound emitted from the speaker unit 21 such that the sound volume becomes the automated sound volume value. Therefore, even when the power supply is turned OFF during, for example, high-speed planing, and the rider increased the sound volume with respect to the automated sound volume value by manipulating the sound volume manipulation member 23b just before the OFF operation, it is possible to prevent a sound with a great volume from being emitted from the audio unit 20 undesirably, when the power supply is turned ON next.

Although not shown in detail, the audio unit 20 may incorporate a volume customize function for customizing the automated sound volume value. For example, the manipulation unit 23 may be provided with a sound volume storage button (not shown). When the sound volume storage button is pressed while the power supply is ON, the amplifier 22 may store a sound volume change amount with respect to the automated sound volume value at that point of time. Then, when the power supply is turned OFF and then turned ON again thereafter, the amplifier 22 may derive the automated sound volume value corresponding to the speed at a time point when the power supply is turned ON, calculate a final sound volume value by adding a stored sound volume change amount to the automated sound volume value, and may perform initial adjustment of the volume of the sound emitted from the speaker unit 21 such that the sound volume becomes the automated sound volume value. This eliminates a need for the user to adjust the sound volume to obtain a desired sound volume every time the power supply is turned ON.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An audio unit mountable in a personal watercraft, comprising:
   a speaker;
   an automated adjustment device connected to the speaker for obtaining an automated sound volume value corresponding directly to an engine speed or a watercraft speed, the automated sound volume value being automatically adjusted based on a change in the engine speed or the watercraft speed, and automatically adjusting a volume of a sound emitted from the speaker based on the automated sound volume value; and
   a sound volume manipulation member configured to be manipulated by a rider to input a change amount of the sound volume with respect to the automated sound volume value,
   wherein the automated adjustment device is configured to adjust the volume of the sound emitted from the speaker such that the volume of the sound is changed from the obtained automated sound value by the change amount of the sound volume, in response to the rider's manual manipulation of the sound volume manipulation member, when a predetermined manipulation permission condition is satisfied, and
   wherein when the engine speed or the watercraft speed satisfies a predetermined deceleration condition, the automated adjustment device cancels a sound volume increase amount with respect to the automated sound volume value which was caused by the rider's manual manipulation of the sound volume manipulation member before the predetermined deceleration condition is satisfied and adjusts the volume of the sound emitted from the speaker such that the volume of the sound becomes the automated sound volume value.

2. The audio unit according to claim 1, wherein the automated sound volume value increases as the engine speed or the watercraft speed increases.

3. The audio unit according to claim 1, wherein the predetermined deceleration condition is such that a decreasing degree of the engine speed or a decreasing degree of the watercraft speed is greater in absolute value than a predetermined value.

4. The audio unit according to claim 3, wherein the predetermined deceleration condition is such that a state in which the decreasing degree of the engine speed or the decreasing degree of the watercraft speed continues to be greater in absolute value than the predetermined value for a predetermined time period.

5. The audio unit according to claim 1, wherein the predetermined deceleration condition is such that the engine speed or the watercraft speed is less than a predetermined value.

6. The audio unit according to claim 1, wherein when the engine speed or the watercraft speed satisfies the predetermined deceleration condition, and the rider manually manipulated the sound volume manipulation member to reduce the volume of the sound to a value less than the automated sound volume value before the predetermined deceleration condition is satisfied, the automated adjustment device adjusts the volume of the sound emitted from the speaker such that the automated sound volume value is added with a sound volume reduction amount caused by the rider's manual manipulation of the sound volume manipulation member.

7. The audio unit according to claim 1, wherein when the manipulation permission condition is not satisfied, the automated adjustment device maintains a state in which the volume of the sound emitted from the speaker is automatically adjusted to become the automated sound volume value, irrespective of the rider's manual manipulation of the sound volume manipulation member.

8. The audio unit according to claim 1, wherein when a power supply of the audio unit is turned ON, the automated adjustment device adjusts the volume of the sound emitted from the speaker such that the volume of the sound becomes the automated sound volume value.

9. The audio unit according to claim 1, wherein the automated adjustment device is built into a handle pad of the personal watercraft.

10. The audio unit according to claim 1, wherein the automated adjustment device is accommodated into a storage box which is opened and closed by a lid.

11. The audio unit according to claim 1, wherein the manipulation permission condition is such that the personal watercraft is planing at a constant speed.

* * * * *